US008952692B2

(12) United States Patent
Takahashi et al.

(10) Patent No.: US 8,952,692 B2
(45) Date of Patent: Feb. 10, 2015

(54) MRI APPARATUS AND METHOD USING CENTER FREQUENCY CORRECTION AND A SMOOTHNESS OF AN INTENSITY DISTRIBUTION TO EXCLUDE IMPLANT REGIONS AND IDENTIFY BODY REGION POSITIONS

(75) Inventors: Naho Takahashi, Otawara (JP); Masato Ikedo, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 776 days.

(21) Appl. No.: 13/157,640

(22) Filed: Jun. 10, 2011

(65) Prior Publication Data

US 2011/0304331 A1 Dec. 15, 2011

(30) Foreign Application Priority Data

Jun. 14, 2010 (JP) .................................. 2010-135129
Apr. 25, 2011 (JP) .................................. 2011-097414

(51) Int. Cl.
*G01R 33/483* (2006.01)
*G01R 33/565* (2006.01)

(52) U.S. Cl.
CPC .......... *G01R 33/483* (2013.01); *G01R 33/5659* (2013.01)
USPC ........... 324/309; 324/307; 324/318; 600/411; 600/424

(58) Field of Classification Search
USPC .......................... 324/300–322; 382/128–131; 600/407–435, 458
See application file for complete search history.

(56) References Cited

U.S. PATENT DOCUMENTS

| 7,420,368 | B2 * | 9/2008 | Miyazaki ...................... 324/307 |
| 7,480,525 | B2 * | 1/2009 | Reeder et al. ................. 600/410 |
| 7,574,248 | B2 * | 8/2009 | Ackerman et al. ............ 600/410 |

(Continued)

FOREIGN PATENT DOCUMENTS

| JP | 2007-275186 | 10/2007 |
| JP | 2008-054738 | 3/2008 |
| JP | 2009-34152 | 2/2009 |

OTHER PUBLICATIONS

Simonetti et al., "3D Breast Segmentation for Image Based Shimming", *Proc. Intl. Soc. Mag. Reson. Med.*, vol. 17, 2009, pp. 2114.

(Continued)

*Primary Examiner* — Melissa Koval
*Assistant Examiner* — Tiffany Fetzner
(74) *Attorney, Agent, or Firm* — Nixon & Vanderhye PC

(57) ABSTRACT

According to one embodiment, a magnetic resonance imaging apparatus includes an image generating unit, a judging unit and a correction unit. The image generating unit receives, from an object, a magnetic resonance signal caused by transmission of an RF pulse to cause a nuclear magnetic resonance, and generates image data of the object based on the magnetic resonance signal. The judging unit identifies an implant region where an implant part exists inside the object, based on the image data. The correction unit acquires magnetic resonance frequency information from a body region which is a region inside the object excluding the implant region, and corrects a center frequency of the RF pulse based on the magnetic resonance frequency information.

18 Claims, 11 Drawing Sheets

(56) References Cited

U.S. PATENT DOCUMENTS

| | | |
|---|---|---|
| 2005/0240096 A1* | 10/2005 | Ackerman et al. ............ 600/410 |
| 2007/0229070 A1* | 10/2007 | Miyazaki ...................... 324/307 |
| 2007/0255131 A1* | 11/2007 | Reeder et al. ................. 600/420 |
| 2008/0015440 A1* | 1/2008 | Shandas et al. ............... 600/458 |
| 2009/0088578 A1* | 4/2009 | Lascola et al. ............... 548/490 |
| 2009/0143668 A1* | 6/2009 | Harms et al. .................. 600/410 |
| 2011/0142316 A1* | 6/2011 | Wang et al. ................... 382/131 |
| 2011/0304331 A1* | 12/2011 | Takahashi et al. ............ 324/309 |

OTHER PUBLICATIONS

JP Office Action dated Aug. 12, 2014 in JP 2011-097414.

* cited by examiner

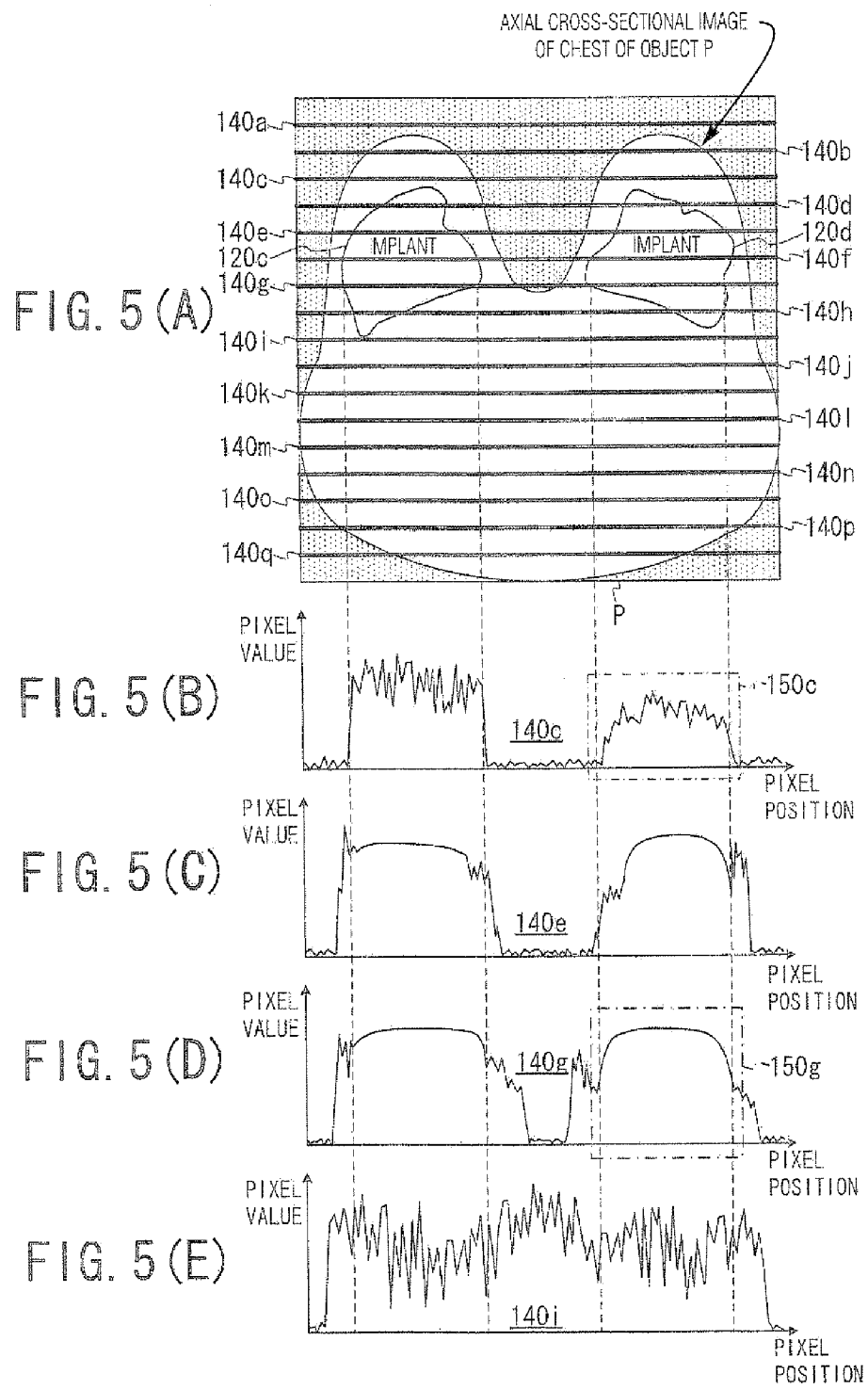

MRI APPARATUS AND METHOD USING CENTER FREQUENCY CORRECTION AND A SMOOTHNESS OF AN INTENSITY DISTRIBUTION TO EXCLUDE IMPLANT REGIONS AND IDENTIFY BODY REGION POSITIONS

CROSS-REFERENCE TO RELATED APPLICATIONS

This application is based upon and claims the benefit of priority from Japanese Patent Application No. 2010-135129 filed on Jun. 14, 2010 and Japanese Patent Application No. 2011-097414 filed on Apr. 25, 2011;

The entire contents of which are incorporated herein by reference.

BACKGROUND

1. Field

Embodiments described herein relate generally to an MRI (magnetic resonance imaging) apparatus and an MRI method.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation.

The aforementioned RF pulse means a radio frequency pulse, and the MR signal means a nuclear magnetic resonance signal.

The center frequency of the RF pulse is set based on the Larmor frequency of a biological tissue (for example, a hydrogen tissue), and this Larmor frequency is determined according to intensity of static magnetic field. Setting of the center frequency of the RF pulse is performed with the correction of static magnetic field intensity distribution, in a preparatory stage of imaging In the case of an object having implants such as medical silicone in her breasts by, for example, breast enlargement surgery, MR signals from water content tissues which constitute body tissues and MR signals from fat tissues are mixed in collected signals. Therefore, there was a case in which a resonance frequency of nuclear spins of hydrogen atoms of water content tissues was unable to be accurately detected, hindered by frequency spectrum components corresponding to MR signals generated from medical silicone and fat tissues, respectively.

Then, a technology to acquire MR signals from an imaging region under a resonance frequency measuring sequence in which a saturation pulse restraining MR signals from fat tissues and an IR pulse restraining MR signals from medical silicone are used as pre-pulses (for example, refer to Japanese Publication of Patent Application No. 2009-34152).

In this technology, a resonance frequency is detected based on a peak frequency of a frequency spectrum of MR signals acquired under the resonance frequency measuring sequence, and a center frequency of RF pulses is set based on the detected resonance frequency. Note that the IR pulse means Inversion Recovery Pulse.

Implants include various types, and with some of them, it is difficult to restrain their MR signals with the use of RF pulses. In those cases, it is desired to set the center frequency of RF pulses after detecting the resonance frequency of the water content tissues precisely by using technology different from the conventional art. However, as it is prior information, it is preferable to judge existence of an implant automatically and precisely.

BRIEF DESCRIPTION OF THE DRAWINGS

In the accompanying drawings:

FIG. 5 is a schematic diagram showing an axial cross-sectional image of the chest of the object P including implants imaged by the MRI apparatus of the present embodiment and each signal intensity profile of a plurality of linear ROIs set on this cross-sectional image;

DETAILED DESCRIPTION

One of the embodiments of the present invention aims to provide MRI technology to judge existence of an implant in such as the chest of an object automatically and precisely, but the present invention is not limited to this aim.

According to one embodiment, a magnetic resonance imaging apparatus includes an image generating unit, a judging unit and a correction unit.

The image generating unit receives, from an object, a magnetic resonance signal caused by transmission of an RF pulse to cause a nuclear magnetic resonance, and generates image data of the object based on the magnetic resonance signal.

The judging unit judges (identifies) an implant region where at least a part of an implant exists in the object, based on the image data.

The correction unit acquires magnetic resonance frequency information from a body region which is a region inside the object excluding the implant region, and corrects a center frequency of the RF pulse based on the magnetic resonance frequency information According to one embodiment, a magnetic resonance imaging method includes the steps of:

(a) receiving, from an object, a magnetic resonance signal caused by transmission of an RF pulse to cause a nuclear magnetic resonance;

(b) generating image data of the object based on the magnetic resonance signal; and (c) judging existence of an implant in the object based on the image data.

A magnetic resonance imaging apparatus and a magnetic resonance imaging method according to embodiments of the present invention will be described with reference to the accompanying drawings.

Note that the same reference numbers are given for identical components in each figure, and overlapping explanation is abbreviated.

Configuration of the Present Embodiment

Figure 1:
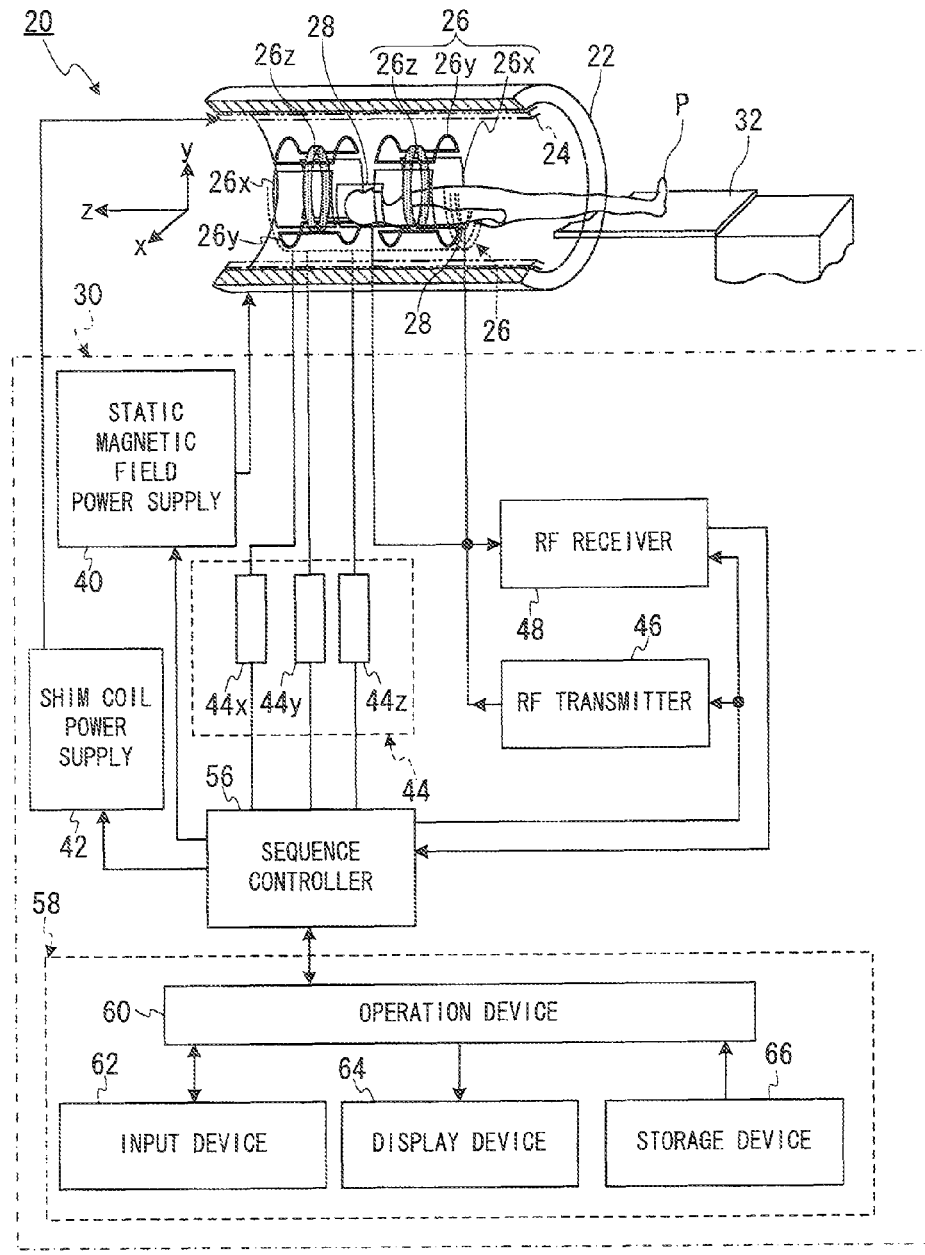
FIG. 1 is a block diagram showing a magnetic resonance imaging apparatus according to an embodiment of the present invention.

FIG. 1 is a block diagram showing general structure of a magnetic resonance imaging apparatus 20 according to an embodiment of the present invention.

As shown in FIG. 1, a magnetic resonance imaging apparatus 20 includes a cylinder-shaped static magnetic field magnet 22 for generating a static magnetic field, a cylinder-shaped shim coil 24 coaxially-arranged inside the static magnetic field magnet 22, a gradient coil 26 (i.e. gradient magnetic field coil 26), RF coils 28, a control system 30, and a bed 32 for placing an object (e.g. a patient) P on it.

Here, as one example, an X axis, a Y axis and a Z axis of an apparatus coordinate system (a device coordinate system) are defined as follows.

Firstly, The X axis, the Y axis and the Z axis are perpendicular to each other.

Secondly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Thirdly, it is assumed that the vertical direction is the same as the Y axis direction.

Fourthly, the bed 32 is disposed in such a position that the direction of "the normal line of the table plane thereof on which an object is put" is the same as the Y axis direction.

The control system 30 includes a static magnetic field power supply 40, a shim coil power supply 42, a gradient magnetic field power supply 44, an RF transmitter 46, an RF receiver 48, a sequence controller 56 and a computer 58.

The gradient magnetic field power supply 44 includes an X-axis gradient magnetic field power supply 44x, a Y-axis gradient magnetic field power supply 44y and a Z-axis gradient magnetic field power supply 44z.

The computer 58 includes an operation device 60, an input device 62, a display device 64 and a storage device 66.

The static magnetic field magnet 22 is electrically connected to the static magnetic field power supply 40 and generates a static magnetic field in an imaging space by using electric current supplied from the static magnetic field power supply 40.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient coil 26 includes an X-axis gradient coil 26x, a Y-axis gradient coil 26y and a Z-axis gradient coil 26z. Each of the X-axis gradient coil 26x, the Y-axis gradient coil 26y and the Z-axis gradient coil 26z is cylinder-shaped and arranged inside the static magnetic field magnet 22.

The X-axis gradient coil 26x, the Y-axis gradient coil 26y and the Z-axis gradient coil 26z are electrically connected to the X-axis gradient magnetic field power supply 44x, the Y-axis gradient magnetic field power supply 44y and the Z-axis gradient magnetic field power supply 44z of the gradient magnetic field power supply 44 respectively.

The X-axis gradient magnetic field power supply 44x, the Y-axis gradient magnetic field power supply 44y and the Z-axis gradient magnetic field power supply 44z supply electric current to the X-axis gradient coil 26x, the Y-axis gradient coil 26y and the Z-axis gradient coil 26z respectively so as to generate a gradient magnetic field Gx in the X-axis direction, a gradient magnetic field Gy in the Y-axis direction and a gradient magnetic field Gz in the Z-axis direction in the imaging space.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axes, by combining gradient magnetic fields Gx, Gy and Gz in the X-axis, Y-axis and Z-axis directions as three physical axes.

The gradient magnetic fields Gss, Gpe and Gro in the slice selection direction, the phase encoding direction and the readout direction are superimposed on the static magnetic field.

The RF transmitter 46 generates RF pulses (RF current pulse) in accordance with control information provided from the sequence controller 56, and outputs the generated RF pulses to the transmission RF coil 28.

The RF coils 28 include a WBC (whole body coil) built in the gantry for transmission and reception of RF pulses and local coils arranged around the bed 32 or the object P for reception of RF pulses.

The transmission RF coil 28 transmits an RF pulse given from the RF transmitter 46 to the object P. The reception RF coil 28 receives an MR signal generated due to excited nuclear spin inside the object P by the RF pulse and this MR signal is detected by the RF receiver 48.

The RF receiver 48 generates raw data which are digitized complex number data obtained by performing A/D (analogue to digital) conversion after performing predetermined signal processing such as filtering to the detected MR signal. The RF receiver inputs the generated raw data to the sequence controller 56.

The operation device 60 performs system control of the magnetic resonance imaging apparatus 20 in imaging operation, and its function will be explained later with FIG. 2.

The sequence controller 56 storages control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 56 generates the gradient magnetic fields Gx, Gy and Gz in the X-axis, Y-axis and Z-axis directions and RF pulses by driving the gradient magnetic field power supply 44, the RF transmitter 46 and the RF receiver 48 according to a predetermined sequence stored. Additionally, the sequence controller 56 receives raw data of an MR signal inputted from the RF receiver 48, and input the raw data to the operation device 60.

Figure 2:
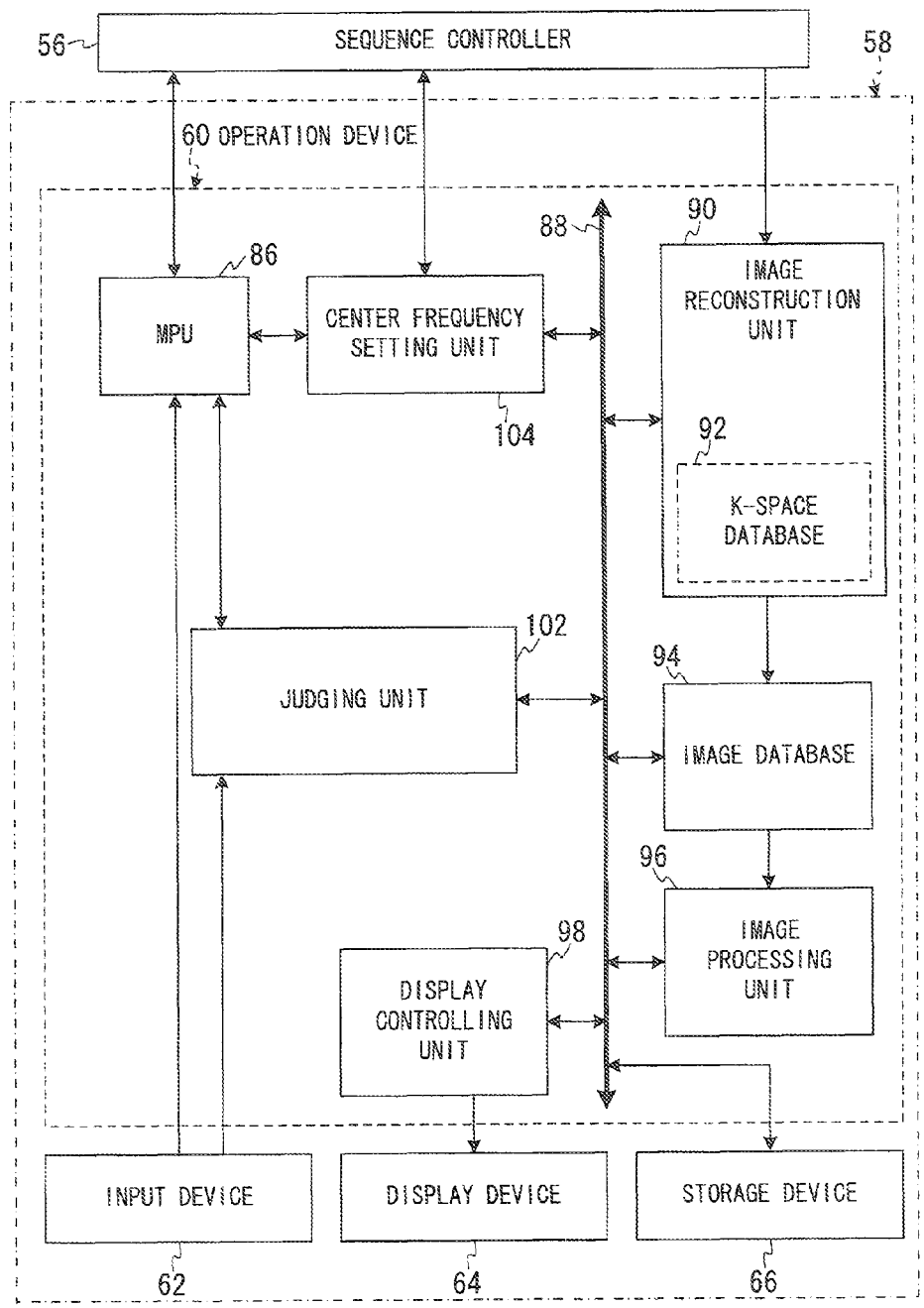
FIG. 2 is a functional block diagram of the computer 58 shown in FIG. 1.

FIG. 2 is a functional block diagram of the computer 58 shown in FIG. 1.

The operation device 60 of the computer 58 includes an MPU (Micro Processor Unit) 86, a system bus 88, an image reconstruction unit 90, an image database 94, an image processing unit 96, a display controlling unit 98, a judging unit 102, and a center frequency setting unit 104.

The MPU 86 performs system control of the MRI apparatus 20 in setting of imaging conditions, imaging operation and image display after imaging through interconnection such as the system bus 88.

Additionally, the MPU 86 functions as imaging conditions setting unit, sets imaging conditions based on command information from the input device 62, and inputs the set imaging conditions into the sequence controller 56. In order to achieve it, the MPU 86 controls the display controlling unit 98 and displays information for setting imaging conditions on the display device 64.

The input device 62 provides a user with a function to set imaging conditions and image processing conditions.

The image reconstruction unit 90 includes a k-space database 92 inside. The image reconstruction unit 90 arranges raw data of MR signals inputted from the sequence controller 56 in the k-space formed in the k-space database 92 as k-space data. The image reconstruction unit 90 generates image data of each slice of the object P by performing image reconstruction processing including such as 2-dimensional Fourier transformation. The image reconstruction unit 90 stores the generated image data in the image database 94.

The image processing unit 96 takes in the image data from the image database 94, performs predetermined image processing on them, and stores the image data after the image processing in the storage device 66 as image data for display.

The storage device 66 stores the image data for display after adding accompanying information such as imaging conditions used for generating the image data for display and information of the object P (patient information) to the image data for display.

The display controlling unit 98 displays a screen for setting imaging conditions and an image indicated by generated image data through imaging on the display device 64 under control of the MPU 86.

The judging unit 102 sets a plurality of linear ROI(Region of Interest)s on image data, and judges whether an implant exists or not based on each signal intensity profile of each linear ROI.

The center frequency setting unit 104 corrects a center frequency of RF pulses based on a frequency spectrum of MR signals from regions which do not include an implant part and the judging result of the judging unit 102. The aforementioned functions of the judging unit 102 and the center frequency setting unit 104 are one of the characteristics of the present embodiment. The method of judging the existence of an implant will be described below.

Figure 3:
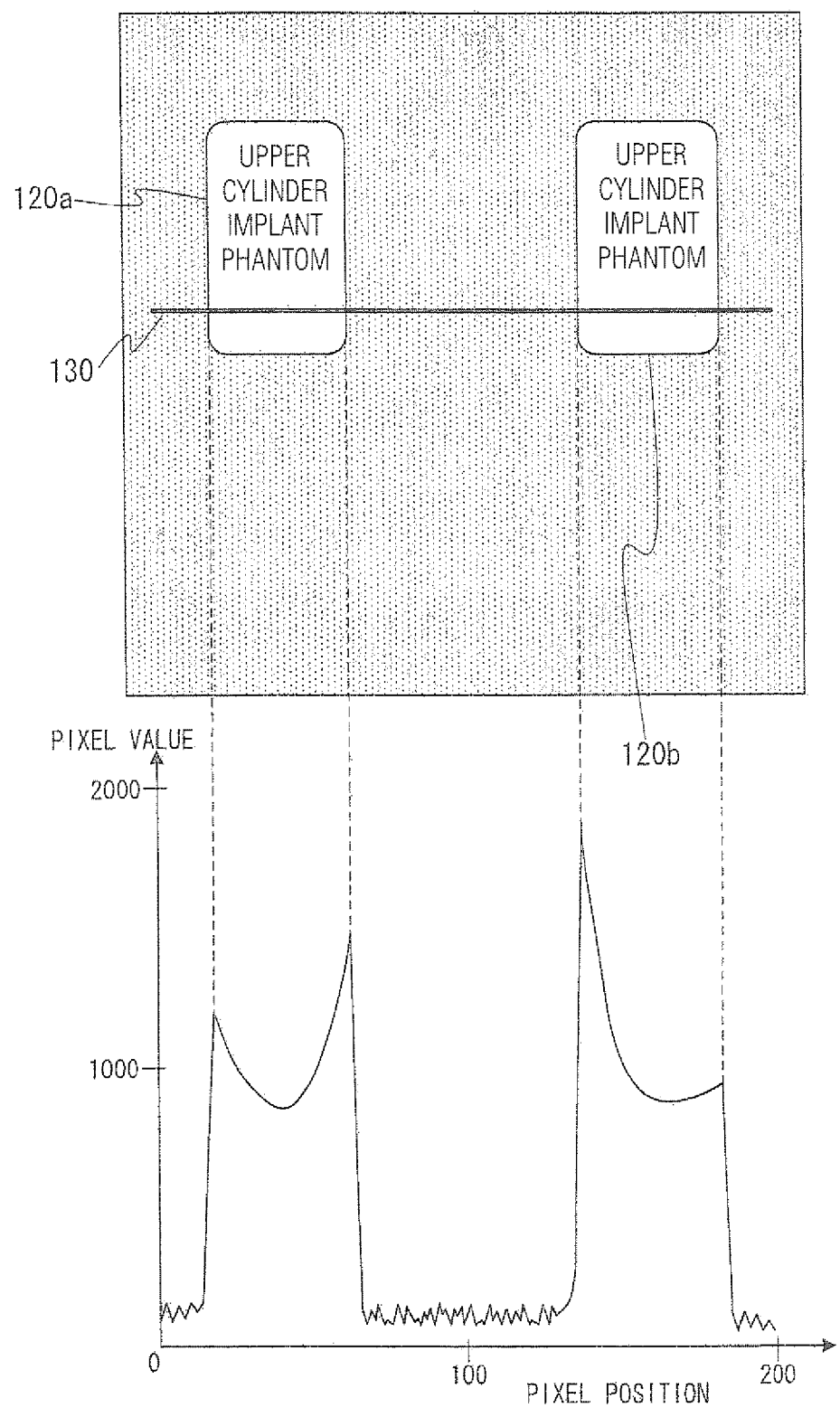
FIG. 3 is a schematic diagram showing an image obtained by imaging two cylinder-shaped implants as phantoms 120a and 120b on the upper side, and a signal intensity profile of their linear ROI 130 on the downside.

FIG. 3 is a schematic diagram showing an image obtained by imaging two cylinder-shaped implants as phantoms 120a and 120b on the upper side, and a signal intensity profile of their linear ROI 130 on the downside. The linear ROI 130 is set as a straight line region passing across the phantoms 120a and 120b in the upper side image of FIG. 3.

Here the term "signal intensity" means, for example, a pixel value determining luminance level of each pixel of the linear ROI 130, and this pixel value changes according to intensity of MR signals in a phantom and an object. That is, a pixel corresponds to a stronger part of the intensity of MR signals in a phantom or an object is displayed with higher luminance, because its pixel value becomes bigger.

Therefore, in the downside of FIG. 3, the ordinate axis indicates a pixel value and the abscissa axis indicates a pixel position in the direction in which the linear ROI exists. Note that regions having stronger intensity of MR signals may be displayed with lower luminance by reducing their pixel values (i.e., black and white parts of an image may be inverted).

Here the term "linear ROI" means, for example, a linearly connected region on an image whose width is one pixel. Hereinafter, it is assumed that linear ROI means a linearly connected image region whose width is one pixel, if linear ROI is solely used without any condition or explanatory word. Note that width of a linear ROI is not limited to one pixel.

For example, width of a linear ROI may be two pixels. In this case, average pixel values of two pixels adjacent to each other in the width direction can be used to form a signal intensity profile of a linear ROI in a way similar to that shown in FIG. 3.

Figure 4:
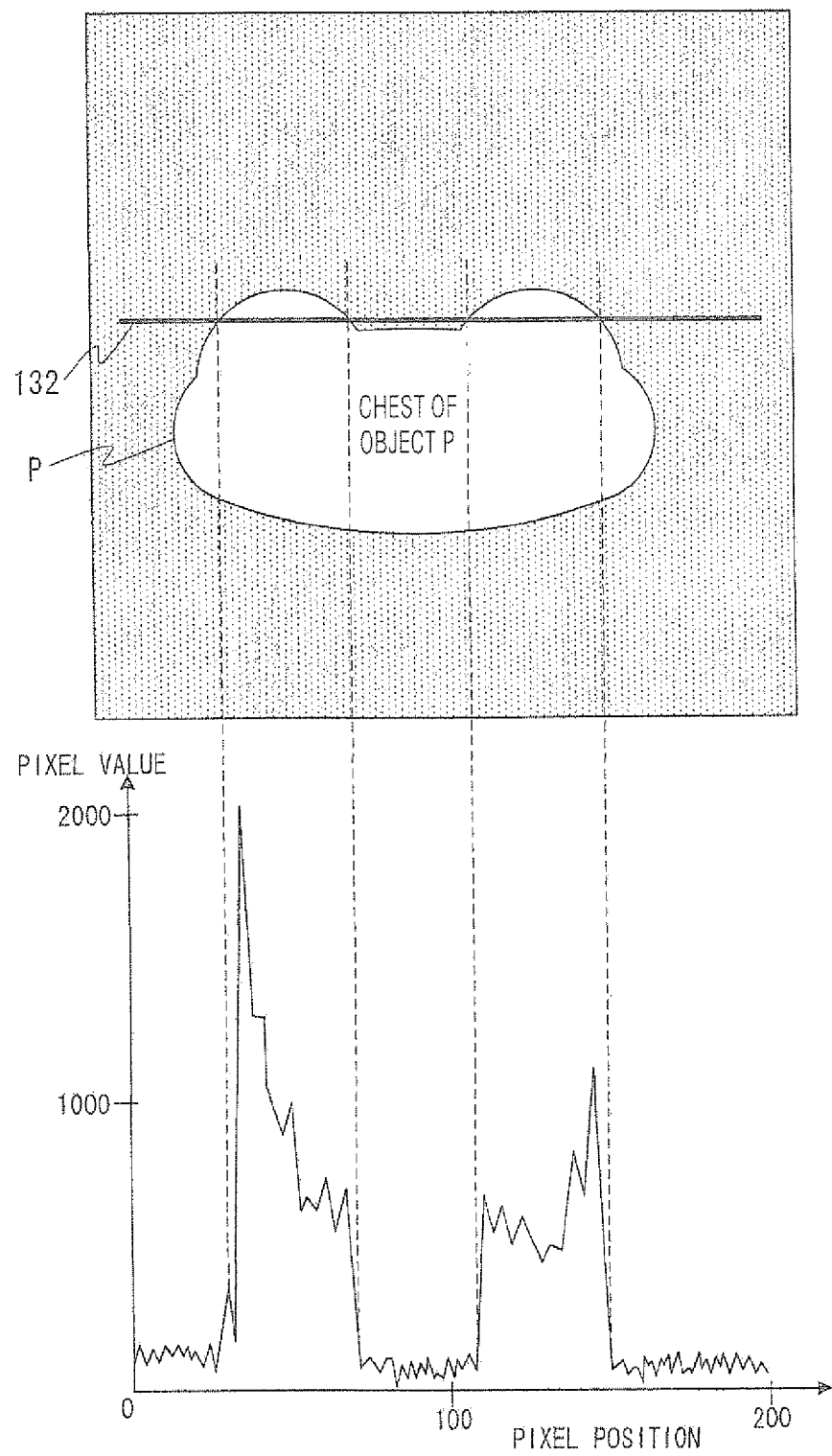
FIG. 4 is a schematic diagram showing an axial cross-sectional image of the chest of an object P which does not include an implant imaged by the MRI apparatus of the present embodiment on the upper side and a signal intensity profile of its linear ROT 132 on the downside in a way similar to that shown in FIG. 3.
Figure 6A:
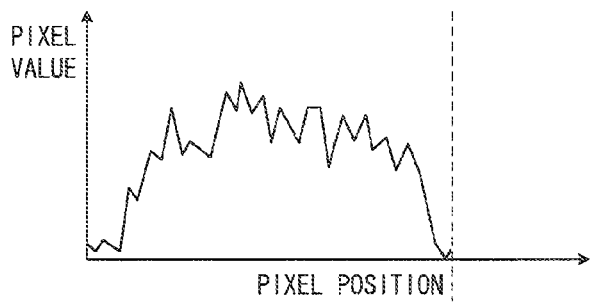
FIG. 6 is a schematic diagram comparing change of signal intensity profile before and after the processing of a low pass filter for an implant region and a body region.
Figure 6B:
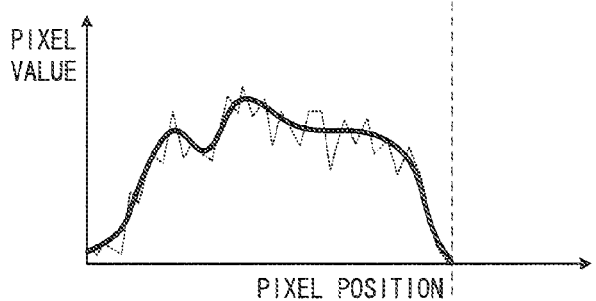
Figure 6C:
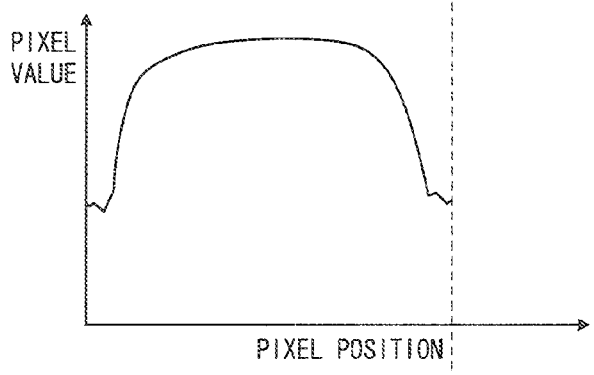
Figure 6D:
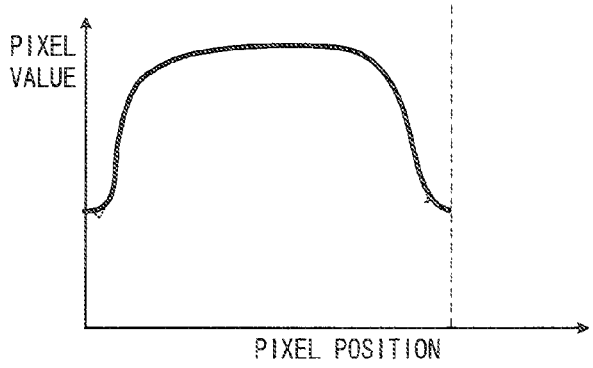

FIG. 4 is a schematic diagram showing an axial cross-sectional image obtained by imaging the chest of an object P which does not include an implant on the upper side, and a signal intensity profile of its linear ROI 132 on the downside in a way similar to that shown in FIG. 3.

Here the word "axial cross-section" means X-Y plane of a human coordinate system when X-axis, Y-axis and Z-axis of the patient coordinate are defined as follows. That is, horizontal direction of the object P is defined as X-axis direction. And front-to-rear direction of the object P is defined as Y-axis direction, assuming that the abdominal side is the front and the back side is the rear. And topside-to-downside direction of the object P is defined as Z-axis direction, assuming that the head side is topside and foot side is downside along the direction of a straight-line approximation of the backbone.

Additionally, in principle, the linear ROI 132 is set so that the linear ROI 132 passes across both breasts of an object P. However, when only one of the breasts is recognized in a chest image of an object, the linear ROI 132 is set so as to pass across one of the breasts. Concretely speaking, when the target imaging region is a left half or a right half, imaging is sometimes performed by denting one of the breasts which is not included in the target imaging region. In this case, even in an axial cross-sectional image, only one of the breasts can be recognized in a chest image of an object, while the other one of the breasts cannot be recognized.

As is obvious by comparing FIG. 3 with FIG. 4, in a region of a biological (human) tissue (hereinafter referred to as a body tissue), a signal intensity profile of a linear ROI is rugged (knurled), i.e. its increase and decrease are intense. On the other hand, in a region of an implant part, a signal intensity profile of a linear ROI is gently sloping (smooth).

The reason is as follows. Change of molecules composing body tissues is microscopically large and variation of signal intensity between pixels adjacent to each other in body tissues becomes large, because body tissues are complicated in configuration. On the other hand, the inside of an implant is formed with materials such as medical silicone, physiological salt(saline) solution and water absorptive polymer. Change of molecules composing an implant is microscopically small and variation of signal intensity between pixels adjacent to each other in an implant region becomes small, because configuration of an implant is simple as compared with body tissues regardless of the aforementioned constituent material.

Note that in the example of FIG. 3, surface coils for receiving MR signals (not shown in figures) are swaddled on the phantom 120a and 120b respectively, and surface sides of the phantom 120a and 120b have higher signal level. This is because the surface sides of the phantom 120a and 120b are closer to the surface coils for receiving MR signals. However, this is only an example, and the signal intensity profile in which inner sides of the phantom 120a and 120b are dented can be made flat by performing appropriate signal processing. However, regardless of this type of signal processing, the following fact does not change. That is a signal intensity profile of an implant becomes smooth (gently sloping) due to simple configuration of an implant.

Then, as an example, a smoothness evaluation value T indicating smoothness of a signal intensity profile is calculated, and existence of an implant is judged based on the smoothness evaluation value T in this embodiment.

FIG. 5 is a schematic diagram showing an axial cross-sectional image of the chest of the object P including implants 120c and 120d and each signal intensity profile of a plurality of linear ROIs set on this cross-sectional image.

FIG. 5 (A) is the axial cross-sectional image of the chest of the object P. The judging unit 102 (see FIG. 2) sets seventeen linear ROIs 140a to 140q on this axial cross-sectional image in parallel with the lateral direction of this image at regular (equal) intervals, as an example.

FIG. 5 (B) is the signal intensity profile of the linear ROI 140c in FIG. 5 (A).

FIG. 5 (C) is the signal intensity profile of the linear ROI 140e in FIG. 5 (A).

FIG. 5 (D) is the signal intensity profile of the linear ROI 140g in FIG. 5 (A).

FIG. 5 (E) is the signal intensity profile of the linear ROI 140i in FIG. 5 (A).

In FIG. 5 (B) to FIG. 5 (E), the longitudinal axis indicates a pixel value and the abscissa axis indicates a pixel position in the direction along which each linear ROI exists.

As shown by FIG. 5 (B) to FIG. 5 (E), in the regions outside the object P, MR signals are scarcely acquired and their pixel values are low. This is because a hydrogen atom does not exist in the regions outside the object P.

In a biological region (hereinafter referred to as a body region), intensity of acquired MR signals is high and their pixel values become large due to existence of hydrogen atoms. This makes the signal intensity profile of body regions rugged for the aforementioned reasons.

In the regions of implants 120c and 120d, the signal intensity profile becomes smooth for the aforementioned reasons.

Here, as an example, a smoothness evaluation value T is defined by the following equation (1) in the present embodiment $$T = \sum_{i=1}^{N} \frac{|A(i) - L(A(i))|^2}{N} \quad (1)$$

In the equation (1), is number of pixels in a linear ROI in the direction along which the linear ROI exists. Here, as an example, the width of a linear ROI is the width of one pixel, so "N" is equal to the number of pixels of a linear ROI.

"i" is one-dimensional coordinate of each pixel in the direction along which each linear ROI exists. In the equation (1), coordinate of one end of each linear ROI is set as "1". In the case of a cross-sectional image whose horizontal and vertical pixel numbers are both 256, "i" takes integer number of 1 to 256.

"A(i)" is a pixel value of each pixel whose position is determined by "i". "L(A(i))" is a function obtained by applying a low pass filter to A(i).

FIG. 6 is a schematic diagram comparing change of signal intensity profile before and after the processing of a low pass filter for an implant region and a body region. In FIG. 6 (A) to FIG. 6 (D), the longitudinal axis indicates a pixel value and the abscissa axis indicates a pixel position in the direction along which a linear ROI exists.

FIG. 6 (A) is the signal intensity profile of the linear ROI 150c (the dashed-dotted line part of FIG. 5 (B)) which is a part of the linear ROI 140c. The linear ROI 150c mainly corresponds to a part of a body region.

FIG. 6 (B) is a signal intensity profile obtained by defining the signal intensity profile of the linear ROI 150c as the aforementioned A(i) and then applying the low pass filter to this A(i).

FIG. 6 (C) is a signal intensity profile of the linear ROI 150g (the dashed-dotted line part of FIG. 5 (D)) which is a part of the linear ROI 140g. The linear ROI 150g mainly corresponds to a part of the implant 120d.

FIG. 6 (D) a signal intensity profile obtained by defining the signal intensity profile of the linear ROI 150g as the aforementioned A(i) and then applying the low pass filter to this A(i).

In FIG. 6 (B) and FIG. 6 (D), profiles before the application of the low pass filter are shown with a dashed line, and profiles after the application of the low pass filter are shown with a bold line As shown by comparing FIG. 6 (C) with FIG. 6 (D), the signal intensity profile of the region of the implant 120d changes little after the application of the low pass filter, because its profile is originally smooth before the application of the low pass filter. That is, a pixel value of each pixel of an implant region does not change a lot after the application of the low pass filter.

Therefore, the smoothness evaluation value T becomes small in an implant region, because the absolute value of A(i)–L(A(i)) in the equation (1) becomes small in an implant region.

Additionally, as shown by FIG. 6 (B), the signal intensity profile of a body region is smoothed after the application of the low pass filter, because its profile is originally rugged before the application of the low pass filter. That is, a pixel value of each pixel of a body region changes after the application of the low pass filter more than the case of an implant region.

Therefore, the smoothness evaluation value T becomes large in a body region, because the absolute value of A(i)–L(A(i)) in the equation (1) becomes large in a body region.

That is, in the case of the smoothness evaluation value T defined by the equation (1) as an example, the smoother the signal intensity profile is, the smaller the smoothness evaluation value T becomes. Therefore, the smoothness evaluation value T in a linear ROI which includes an implant part is smaller than that of a linear ROI which does not include an implant part.

The judging unit 102 calculates smoothness evaluation value T for each of the linear ROI 140a to 140q in FIG. 5. Then, the judging unit 102 judges that a linear ROI whose smoothness evaluation value T is smaller than the first threshold value includes an implant part, and a linear ROI whose smoothness evaluation value T is equal to or larger than the first threshold value does not include an implant.

Note that as the low pass filter, for example, a filter which cuts any one range in the high frequency components of top 10% to 90%, out of the spatial-frequency components included in a signal intensity profile may be used.

The aforementioned filter which cuts top 10% of high frequency components means, for example, a filer which cuts frequency components higher than 900 Hz, when the spatial-frequency components included in a signal intensity profile are 0.1 Hz to 1000 Hz. In this case, this filter is a low pass filter whose cutoff frequency is 900 Hz.

The aforementioned filter which cuts top 90% of high frequency components means, for example, a filer which cuts frequency components higher than 100 Hz, when the spatial-frequency components included in a signal intensity profile are 0.1 Hz to 1000 Hz.

That is, it is preferable to analyze the spatial-frequency components included in a signal intensity profile, determine the maximum frequency which should pass a low pass filter (the spatial-frequency range which passes a low pass filter) appropriately according to the result of the analysis, and use the low pass filter whose cutoff frequency is this maximum frequency.

The above word "appropriately" means to make the margin between the smoothness evaluation value T of a body region calculated by the equation (1) and the smoothness evaluation value T of an implant region calculated by the equation (1) large enough, so that both are distinguishable from each other.

Therefore, it is preferable to appropriately change the cutoff frequency of the low pass filter according to the spatial-frequency components included in a signal intensity profile.

Figure 7:
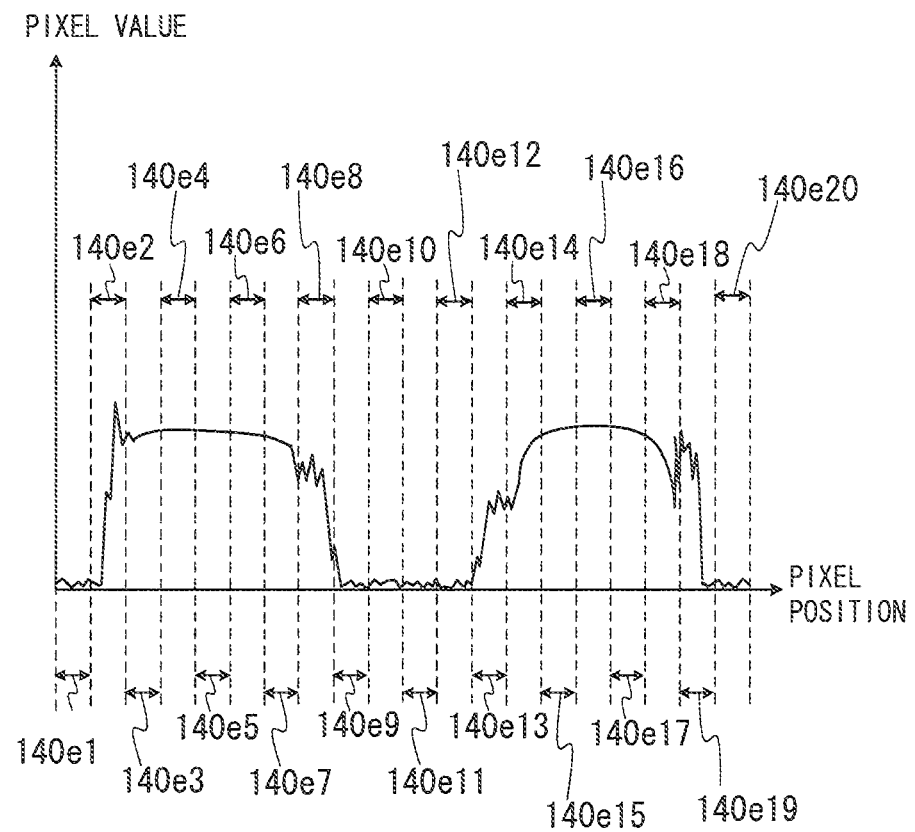
FIG. 7 is a schematic diagram obtained by dividing the signal intensity profile of the linear ROI 140e in FIG. 5 (C) by 20, as an example of dividing a linear ROI into plural regions and judging existence of an implant for every divided region.

FIG. 7 is a schematic diagram obtained by dividing the signal intensity profile of the linear ROT 140e in FIG. 5 (C) into 20 regions, as an example of dividing a linear ROT into plural regions and judging existence of an implant for every divided region. That is, as each border is shown in FIG. 7 with dashed lines, the linear ROT 140e is divided into 20 regions (divided regions 140e1 to 140e20) from end to end in succession. And the smoothness evaluation values T1 to T20 are calculated for each of the divided regions 140e1 to 140e20, respectively.

For example, when the pixel number is 200 in the direction along which the linear ROI 140e exists, the pixel number of each of the divided regions 140e1 to 140e20 is 10 (i.e. 200/20=10). In this case, the smoothness evaluation value T1 for the divided regions 140e1 is calculated by the equation (2) as follows, and the smoothness evaluation value T2 for the divided regions 140e2 is calculated by the equation (3) as follows.

$$T1 = \sum_{i=1}^{10} \frac{|A(i) - L(A(i))|^2}{10} \quad (2)$$

$$T2 = \sum_{i=11}^{20} \frac{|A(i) - L(A(i))|^2}{10} \quad (3)$$

The smoothness evaluation values T3 to T20 for the divided regions 140e3 to 140e20 are calculated in the similar way. The judging unit 102 identifies a body region and an implant region based on these smoothness evaluation values T1 to T20.

For example, in the case of the linear ROI 140e, the judging unit 102 calculates the average pixel value for each of the divided regions 140e1 to 140e20, respectively. Thereby, the judging unit 102 judges that the divided region (any of 140e1 to 140e20) whose average pixel value is smaller than the second threshold value is the region outside the object P. For example, in the case of the linear ROI 140e in FIG. 5 and FIG. 7, the divided regions 140e1, 140e9, 140e10, 140e11, 140e12, 140e20 are judged as the regions outside the object P.

Moreover, as to the divided regions whose average pixel value is equal to or larger than the second threshold value, the judging unit 102 judges that the divided region whose smoothness evaluation value (any of T1 to T20) is smaller than the third threshold value is an implant region, and other divided regions are body regions.

For example, in the case of the linear ROI 140e in FIG. 5 and FIG. 7, the divided regions 140e2, 140e8, 140e13 and 140e19 are judged as body regions, and the divided regions 140e3, 140e4, 140e5, 140e6, 140e7, 140e14, 140e15, 140e16, 140e17 and 140e18 are judged as implant regions.

Figure 8:
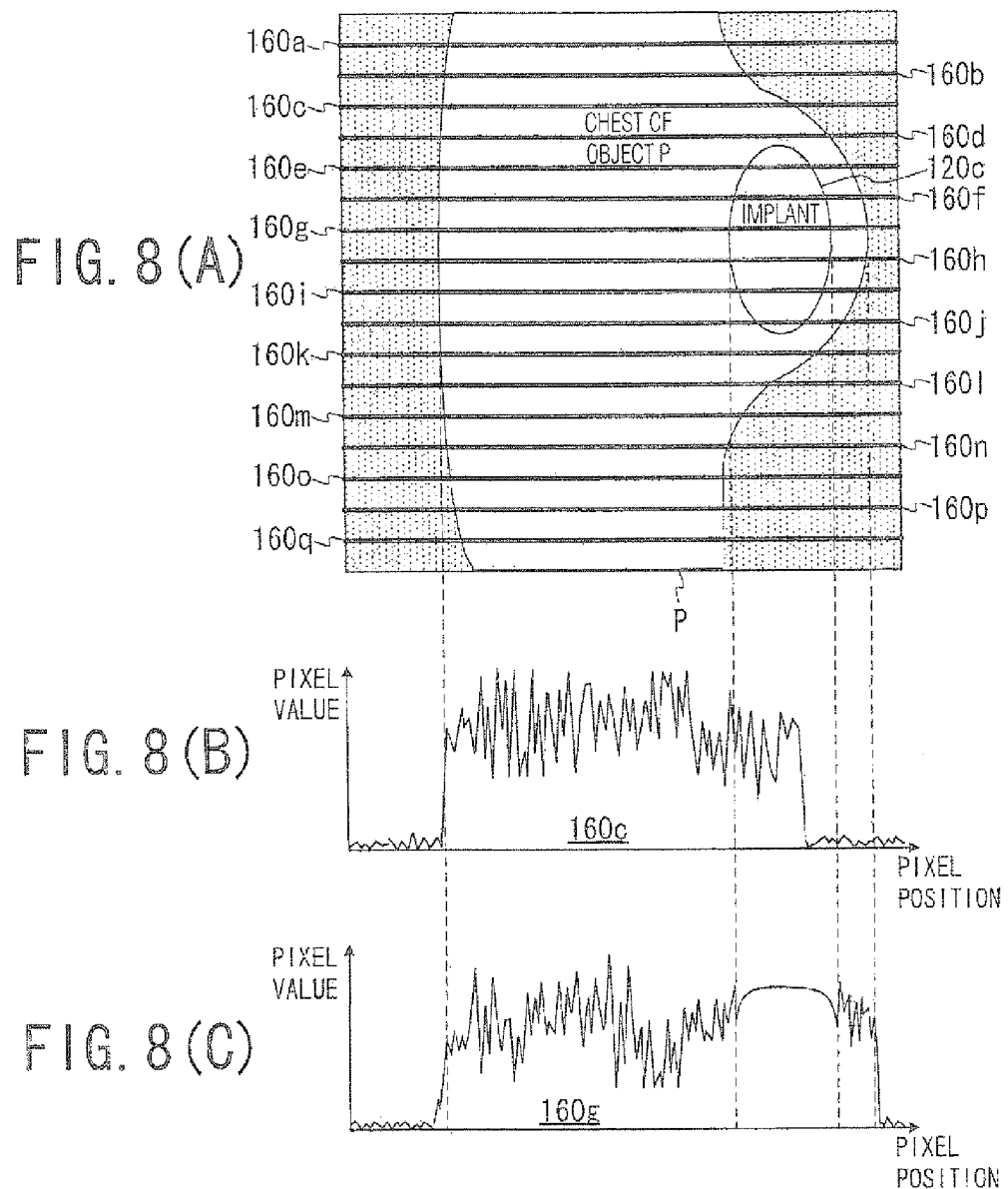
FIG. 8 is a schematic diagram showing a sagittal cross-sectional image of the chest the object P including implants imaged by the MRI apparatus of the present embodiment and each signal intensity profile of a plurality of linear ROIs set on this sagittal cross-sectional image.

FIG. 8 is a schematic diagram showing a sagittal cross-sectional image of the chest of the object P including implants imaged by the MRI apparatus 20 of the present embodiment, and each signal intensity profile of a plurality of linear ROIs set on this sagittal cross-sectional image. Here the sagittal cross-section means Y-Z plane of the human coordinate system.

FIG. 8 (A) is a sagittal cross-sectional image including one of the breasts of the object P, and the judging unit 102 sets seventeen linear ROIs 160a to 160q on this sagittal cross-sectional image in a way similar to that shown in FIG. 5 (A).

FIG. 8 (B) shows the signal intensity profile of the linear ROI 160c in a way similar to that shown in FIG. 5 (B).

FIG. 8 (C) shows the signal intensity profile of the linear ROI 160g in a way similar to that shown in FIG. 5 (B).

As shown by FIG. 8 (A), the linear ROI 160c does not include an implant part, but mainly includes a body region. Therefore, the change of pixel values (MR signal intensity) of the linear ROI 160c is sharp as shown in FIG. 8 (B).

On the other hand, as shown by FIG. 8 (A), the linear ROI 160g includes a part of the implant 120c. Thus, the change of pixel values (MR signal intensity) of a part of linear ROI 160g corresponding to the part of the implant 120c is smooth as shown in FIG. 8 (C).

Figure 9:
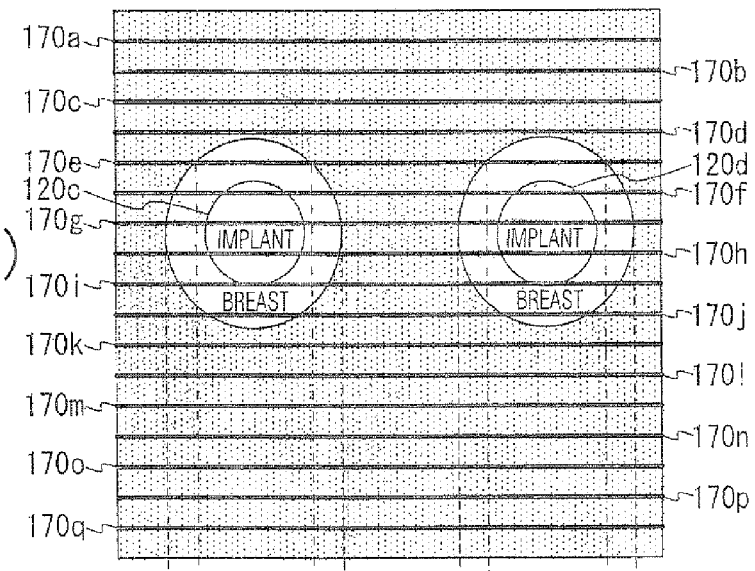
FIG. 9 is a schematic diagram showing a coronal cross-sectional image of the chest the object P including implants imaged by the MRI apparatus of the present embodiment and each signal intensity profile of a plurality of linear ROIs set on this coronal cross-sectional image.
Figure 9:
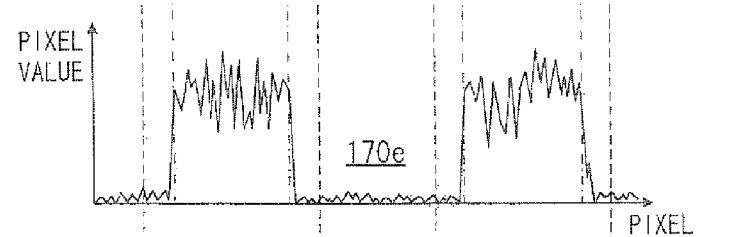
Figure 9:
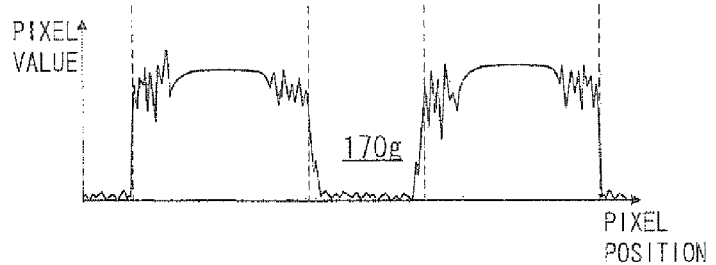

FIG. 9 is a schematic diagram showing a coronal cross-sectional image of the chest of the object P including implants imaged by the MRI apparatus 20 of the present embodiment, and each signal intensity profile of a plurality of linear ROIs set on this coronal cross-sectional image. Here the coronal cross-section means X-Z plane of the human coordinate system.

FIG. 9 (A) is a coronal cross-sectional image including both breasts of the object P, and the judging unit 102 sets seventeen linear ROIs 170a to 170q on this coronal cross-sectional image in a way similar to that shown in FIG. 5 (A).

FIG. 9 (B) shows the signal intensity profile of the linear ROI 170e in a way similar to that shown in FIG. 5 (B).

FIG. 9 (C) shows the signal intensity profile of the linear ROI 170g in a way similar to that shown in FIG. 5 (B).

As shown by FIG. 9 (A), the linear ROI 170e does not include an implant part, but includes a body region. Therefore, the change of pixel values of the linear ROI 170e is sharp as shown in FIG. 9 (B).

On the other hand, as shown by FIG. 9 (A), the linear ROI 170g includes parts of the implants 120c and 120d. Thus, the change of pixel values of a part of the linear ROI 170g corresponding to the parts of the implants 120c and 120d is smooth as shown in FIG. 9 (C).

Both in the case of the sagittal cross-sectional image in FIG. 8 and the coronal cross-sectional image in FIG. 9, existence of an implant can be judged for each of the linear ROIs 160a to 160q and 170a to 170q respectively in the way explained with FIG. 5, FIG. 6 and the equation (1).

Additionally, by dividing each of the linear ROIs 160a to 160q and 170a to 170q into a plurality of divided regions, each divided region can be judged as one of an implant region, a body region and a region outside the object PEI in the way explained with FIG. 7, and the equations (2) and (3).

(Operation of the MRI Apparatus)

Figure 10:
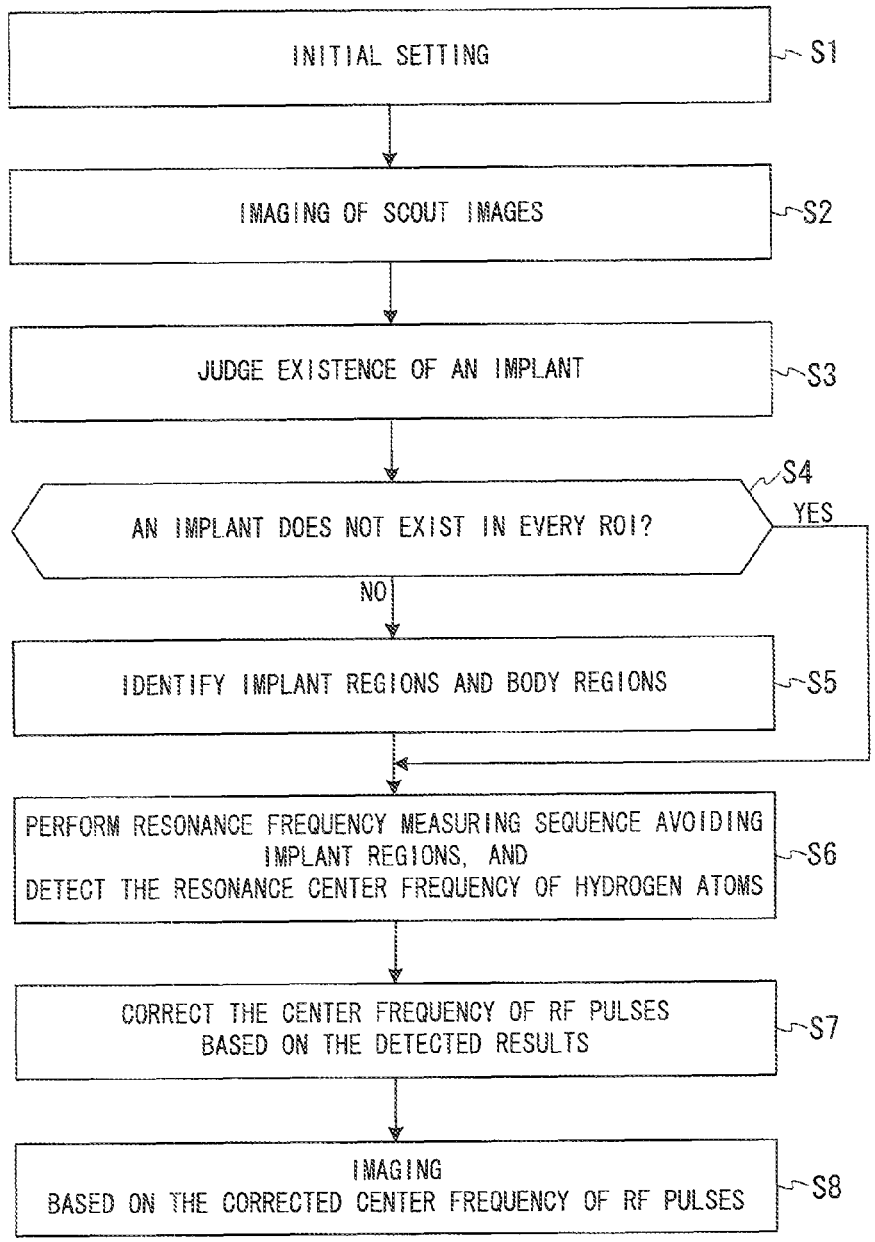
FIG. 10 is a flowchart illustrating a flow of a process performed by the MRI apparatus of the present invention.

FIG. 10 is a flowchart illustrating a flow of a process performed by the MRI apparatus 20 of the present invention. In the following, according to the step numbers in the flowchart shown in FIG. 10, an operation of the MRI apparatus 20 will be described by referring to the aforementioned FIGS. 1 to 9 as required.

[step S1] The MPU 86 (see FIG. 2) performs initialization of the MRI apparatus 20 based on information such as information inputted to the input device 62. In this initialization, postural information on the object P in the X-axis, Y-axis and Z-axis of the apparatus coordinate system, a provisional center frequency of RF pulses in imaging of scout images (pilot images) and so on are set.

Note that the display device 64 and the input device 62 are configured to enable a user to select, in step S1, which one of an axial cross-section, a coronal cross-section and a sagittal cross-section is used in judgment of existence of an implant and identification of body regions and implant regions.

In the case of examination of only one side of the chest (i.e. right or left side of the chest), a sagittal cross-sectional image of the human coordinate system may be used in judgment of existence of an implant. However, in the case of examination of both sides of the chest, it is preferable to use an axial or coronal cross-sectional image of the human coordinate system in judgment of existence of an implant.

Then, the process proceeds to Step S2.

[step S2] The sequence controller 56 drives a bed controlling system which is not shown in figures, moves the bed 32 (see FIG. 1) on which the object P is set, and floodlights the imaging region of the object P (the chest in this example) with a projector which is not shown in figures. After this operation, the bed 32 moves to the position which locates the imaging region of the object P on the center of the magnetic field in the gantry, and image data of scout images in the axial cross-section, the coronal cross-section and the sagittal cross-section are generated.

More specifically, the MRI apparatus 20 transmits RF pulses and so on for acquiring image data, and detects MR signals from the object P with the RF receiver 48. The sequence controller 56 inputs raw data of MR signals into the image reconstruction unit 90.

Then, the image reconstruction unit 90 generates the image data of scout images by performing predetermined processing on the raw data, and inputs the image data of the scout images into the image database 94.

The image processing unit 96 performs predetermined image processing on the inputted image data of the scout images, and the storage device 66 stores the image data of the scout images after the image processing.

Then, the process proceeds to Step S3.

[step S3] The judging unit 102 acquires, from the storage device 66, the image data of the scout images which are set in step S1 for judging existence of an implant. The judging unit 102 sets a plurality of linear ROIs on these acquired image data in the aforementioned manner (see FIG. 5, FIG. 8 and FIG. 9).

In terms of judging (determining) existence of an implant, it is desirable to set 5 or more than 5 of linear ROIs, and it is more desirable to set 10 or more than 10 of linear ROIs.

The linear ROIs may be set over an entire image at regular intervals from top to bottom of the image or from right to left of the image, as shown in FIG. 5, FIG. 8 and FIG. 9. However, this is only an example.

For example, the judging unit 102 may extract the regions of the breasts of the object P in the scout images by performing template matching with the regions corresponding to the object P in the scout images, based on a standard human body model including configuration and size of each bone and organ of a human body. In this case, the judging unit 102 sets linear ROIs on only a part of the image, so that all the linear ROIs pass across the region of the breast of the object P. Thereby, a process of calculating the smoothness evaluation value T on regions which do not include an implant part such as a linear. ROT in the back of the object P can be omitted in judgment of existence of an implant.

Next, the judging unit 102 calculates the smoothness evaluation value T on all of the set linear ROIs by the equation (1), and judges (determines) the existence of an implant part for each of the linear ROIs respectively, as an example.

Note that it is not necessary to perform the calculation of smoothness evaluation value T and the aforementioned judgment on all of the linear ROIs.

For example, in the case of a plurality of linear ROIs set in the lateral direction of an image, the judgment of the existence of an implant may be performed from a linear ROI in the top of the image (to the bottom) in sequence, and the calculation of smoothness evaluation value T and the aforementioned judgment may be stopped when a linear ROI including an implant part is detected.

Then, the process proceeds to Step S4.

[step S4] When a linear ROI which includes an implant part is detected in the step S3, the process proceeds to Step S5. When it is judged that all the linear ROIs do not include an implant part in the step S3, the process proceeds to Step S6.

[step S5] The judging unit 102 divides linear ROIs into a plurality of divided regions, and judges which of an implant region, a body region and a region outside the object P each linear ROI belongs to, in the aforementioned method (see FIG. 7, and the equations (2) and (3)). Note that this calculation load may be reduced by performing the judgment only on the linear ROIs which are judged as including an implant part.

Alternatively, because it is preferable to identify body regions as target regions of the after-mentioned resonance frequency measuring pulse sequence, the above judgment may be performed on all of the linear ROIs in order to identify "body regions" and "regions outside the object P".

Then, the process proceeds to Step S6.

[step S6] The center frequency setting unit 104 sets the identified body region(s) as an acquisition region of MR signals based on the above judgment result, and detects a center frequency of magnetic resonance of hydrogen atoms in hydrogen tissues as body tissues. The acquisition region of MR signals will be explained below under 2 cases, depending on the judgment result in step S3 and S4.

When it is judged that none of the linear ROIs include an implant part, for example, a body region is identified based on the scout images, and a part or entirety of the identified body regions is determined as the acquisition region of MR signals. Note that a region outside the object P scarcely includes hydrogen atoms, and its MR signal intensity is low. Therefore, for example, a body region and a region outside the object P can be distinguished from each other by performing threshold processing on each pixel value of the scout images.

When it is judged that at least one of the linear ROIs includes an implant part, there are two cases for the acquisition region of MR signals.

Firstly, out of divided regions each of which is a part of a linear ROI judged as including an implant part, regions around the divided region judged as a body region may be determined, as the acquisition region of MR signals. For example, in the case of the linear ROI 140$e$ shown in FIG. 5 and FIG. 7, a small region which includes at least one of the divided regions 140$e$2, 140$e$8, 140$e$13 and 140$e$19 may be determined as the acquisition region of MR signals. In this case, the small region means a region whose width in the direction orthogonal to the direction of an extending straight line of a linear ROI is narrower than the interval between each linear ROI and whose length in the direction along an extending straight line of an linear ROI is shorter than the length of each divided region. This is because if the small region is too large, the small region may include an implant part.

Secondly, a body region selected by avoiding linear ROIs judged as including an implant part may be determined as the acquisition region of MR signals. For example, the body region as the acquisition region of MR signals can be selected by performing threshold processing on each pixel value of the scout images, identifying regions inside the object P, and avoiding linear ROIs judged as including an implant part out of the regions identified as inside of the object P. Note that, when all the linear ROIs are divided into divided regions and each divided region is judged as one of a body region, an implant region and a region outside the object P in step S5, the body region as the acquisition region of MR signals may be selected based on the above judgment result.

The center frequency setting unit 104 sets the acquisition region of MR signals, and input this acquisition region of MR signals into the MPU 86 and the sequence controller 56.

The MPU 86 sets conditions of the resonance frequency measuring pulse sequence in which a saturation pulse for suppressing MR signals from fat tissues and so on are set as pre-pulses. The MPU 86 inputs the conditions of the resonance frequency measuring pulse sequence into the sequence controller 56.

The sequence controller 56 performs the resonance frequency measuring pulse sequence by controlling each part of the MRI apparatus 20, acquires MR signals from the aforementioned acquisition region, and inputs the acquired MR signals into the center frequency setting unit 104.

The center frequency setting unit 104 detects the peak frequency of the frequency spectrum of the acquired MR signals as the resonance frequency of nuclear spins of hydrogen atoms in hydrogen tissues. As to the resonance frequency measuring pulse sequence and the analysis of the frequency spectrum, for example, conventional art such as the technology explained in Japanese Publication of Patent Application No. 2009-34152 may be used.

The center frequency setting unit 104 stores the detected resonance frequency of nuclear spins of hydrogen atoms as the first provisional center frequency.

Next, the center frequency setting unit 104 makes the MRI apparatus 20 perform the above resonance frequency measuring pulse sequence again without changing the acquisition region, detects the resonance frequency of nuclear spins of hydrogen atoms, and stores the resonance frequency detected this time as the second provisional center frequency.

Next, the center frequency setting unit 104 compares the second provisional center frequency with the first provisional center frequency.

The center frequency setting unit 104 repeats detection processing until the result of the judgment processing becomes affirmative. The above detection processing means processing which detects a provisional center frequency by the resonance frequency measuring pulse sequence in the aforementioned method. And the above judgment processing means processing which judges whether the finally detected provisional center frequency is within the range of a convergence value or not.

It is determined in the following manner as to whether the provisional center frequency obtained the latest is convergent or not. This may be determined, for example, by judging whether "the margin between the maximum value and minimum value of the consecutive (newest) four provisional center frequencies numbering from the one obtained the latest" is within the range of a predetermined value or not. In the case of the static magnetic field whose intensity is 1.5 tesla, the aforementioned predetermined value is, for example, 20 Hz.

When the result of the "judgment processing" is affirmative, the center frequency setting unit 104 stores the provisional center frequency obtained the latest as the center frequency of magnetic resonance of nuclear spins of hydrogen atoms of hydrogen tissues in the acquisition region.

Then, the process proceeds to Step S7.

[step S7] The center frequency setting unit 104 corrects the center frequency of RF pulses provisionally set in step S1. That is, the center frequency setting unit 104 sets lithe center frequency of magnetic resonance of nuclear spins of hydrogen atoms of hydrogen tissues detected and finally determined in step S6 as the center frequency of RF pulses.

Additionally, the MPU 86 sets other imaging conditions including a pulse sequence for imaging based on inputted information and so on.

Then, the process proceeds to Step S8.

[step S8] Data acquisition is performed according to the center frequency of RF pulses corrected in step S7 and other imaging conditions set before step S8.

More specifically, the object P is set on the bed 32 in advance and a static magnetic field is formed in the imaging space by the static magnetic field magnet 22 excited by the static magnetic field power supply 40. In addition, electric current is supplied from the shim coil power supply 42 to the shim coil 24, thereby the static magnetic field formed in the imaging space is uniformed.

Then, when the MPU 86 receives a command of start of imaging from the input device 62, the MPU 86 inputs imaging conditions including a pulse sequence into the sequence controller 56. Then, the sequence controller 56 drives the gradient magnetic field power supply 44, the RF transmitter 46 and the RF receiver 48 according to the inputted pulse sequence, thereby a gradient magnetic field is formed in the imaging region, where the object P is set, and RF signals are generated from the RF coil 28.

Then, MR signals generated by nuclear magnetic resonance inside the object P are received by the RF coil 28 and transmitted to the RF receiver 48. The RF receiver 48 performs predetermined signal processing on the detected MR signals and then performs A/D conversion the MR signals to generate raw data, which are digital data of the MR signals. The RF receiver 48 inputs the generated raw data to the sequence controller 56.

The sequence controller 56 inputs the raw data to the image reconstruction unit 90.

The image reconstruction unit 90 arranges the raw data in the k-space formed in the k-space database 92 as k-space data.

The image reconstruction unit 90 obtains the k-space data from the k-space database 92 and reconstructs image data by performing image reconstruction processing including Fourier transformation on the obtained k-space data. The image reconstruction unit 90 stores the reconstructed image data in the image database 94.

The image processing unit 96 obtains the image data from the image database 94 and generates image data for 2-dimentional display by performing image processing such as, for example, MIP (Maximum Intensity Projection) on the obtained image data. The image processing unit 96 stores the image data for 2-dimentional display in the storage device 66. The foregoing is a description of an operation of the MRI apparatus 20 according to the present embodiment.

According to the aforementioned embodiment, existence of an implant in a body part such as the chest of an object and so on can be judged automatically and precisely in MRI.

More specifically, a plurality of linear ROIs are extracted from scout images, the smoothness evaluation values (T) indicative of smoothness of profiles of linear ROIs are calculated, and existence of an implant is judged based on the smoothness evaluation values. Therefore, existence of an implant can be judged accurately.

Then, a body region selected by infallibly avoiding an implant part based on the above judgment result is set as the acquisition region of MR signals for the resonance frequency measuring pulse sequence. Therefore, even if an implant whose MR signals are hard to restrain with RF pulses is included in an object, the center frequency of magnetic resonance of hydrogen atoms in a body region can be exactly detected.

Moreover, the resonance frequency measuring pulse sequence is repeated until the center frequency value detected by the resonance frequency measuring pulse sequence nearly converges. Therefore, the center frequency of magnetic resonance of hydrogen atoms in a body region can be detected more precisely.

Because the center frequency of RF pulses in an imaging sequence is set based on the resonance frequency of hydrogen atoms precisely detected in the above method, favorable images can be obtained.

Additionally, when it is judged that an implant is included, each of linear ROIs including an implant part is divided into a plurality of divided regions, and an attribute of each divided region is judged. Namely, it is judged which of a body region, an implant region and a region outside an object each divided region belongs to. Therefore, not only a region excluding a breast in which an implant is included, but also a body region close to a linear ROI which includes an implant part can be set as the acquisition region of MR signals in the resonance frequency measuring pulse sequence. That is, the range of choice for the acquisition region of MR signals in the resonance frequency measuring pulse sequence is broadened.

Supplementary Notes of the Embodiment

[1] In the present embodiments, there has been described an example in which judgment of existence of an implant and analysis of implant-free regions (regions without an implant part) are performed by using scout images. However, embodiments of the present invention are not limited to such an aspect. For example, the judgment of existence of an implant may be performed by using images of the same target region (the chest in this example) obtained in a preceding imaging sequence.

Alternatively, images generated by performing image processing (image transformation) on images obtained directly by imaging sequence such as MPR (Multi Planar Reconstructions) can be used for judgment of existence of an implant. For example, when volume data consisting of 50 axial cross-sectional images of the chest exists, a sagittal cross-sectional image passing across the center of the right breast and a sagittal cross-sectional image passing across the center of the left breast can be generated by image processing based on the volume data. Then, existence of an implant may be judged by using these two sagittal cross-sectional images.

[2] There has been described an example in which the judgment of existence of an implant and analysis of implant-free regions are performed for the chest of the object P. However, embodiments of the present invention are not limited to such an aspect. For example, the sequence of the above embodiment is also applicable when an implant of medical silicone exists in a part of the object P excluding the chest.

[3] There has been described an example in which signal intensity profiles of linear imaging regions are calculated, and judgment of existence of an implant and identification of implant regions are performed based on the signal intensity profiles. However, embodiments of the present invention are not limited to such an aspect. For example, a linear ROI may be a curved region such as an arcuate region.

[4] There has been described an example in which seventeen linear ROIs are set at regular intervals for one cross-sectional image. However, embodiments of the present invention are not limited to such an aspect. It is not necessary to set linear ROIs at regular intervals (it is not necessary to equalize the interval of each linear ROI). Additionally, the number of linear ROIs is not limited to 17 but can be other number such as 10.

[5] There has been described an example in which the smoothness evaluation values (T) are calculated based on signal intensity profiles obtained from pixel values of respective pixels of linear ROIs, and regions with a smaller smoothness evaluation value T is judged as an implant region, because the smoother a signal intensity is, the smaller its smoothness evaluation value T becomes. However, embodiments of the present invention are not limited to such an aspect.

Although the value "T" calculated by the equation (1) is termed the smoothness evaluation value, the value "T" calculated by the equation (1) may be construed as a roughness evaluation value which indicates how rugged a signal intensity profile is. In this case, the larger the roughness evaluation value T is, the more rugged its signal intensity profile is. And a region with a larger roughness evaluation value T is judged as a body region. Whether the smoothness evaluation value or the roughness evaluation value, it is only a difference of interpretation and is technically equal.

[6] There has been described an example in which the center frequency of RF pulses is set based on the judgment result of existence of an implant and the analysis result of implant-free regions. However, this is only an example. The judgment result of existence of an implant and the analysis result of implant-free regions can be used for other aims.

For example, after identifying implant regions according to the aforementioned analysis result, MR signals from the implant may be suppressed based on the resonance frequency of the constituent material of the implant. More specifically, for example, a spatially-selective and frequency-selective presaturation pulse (for example, a saturation pulse which tilts a longitudinal magnetization vector by 90 degrees) may be applied to the identified implant regions.

Figure 11:
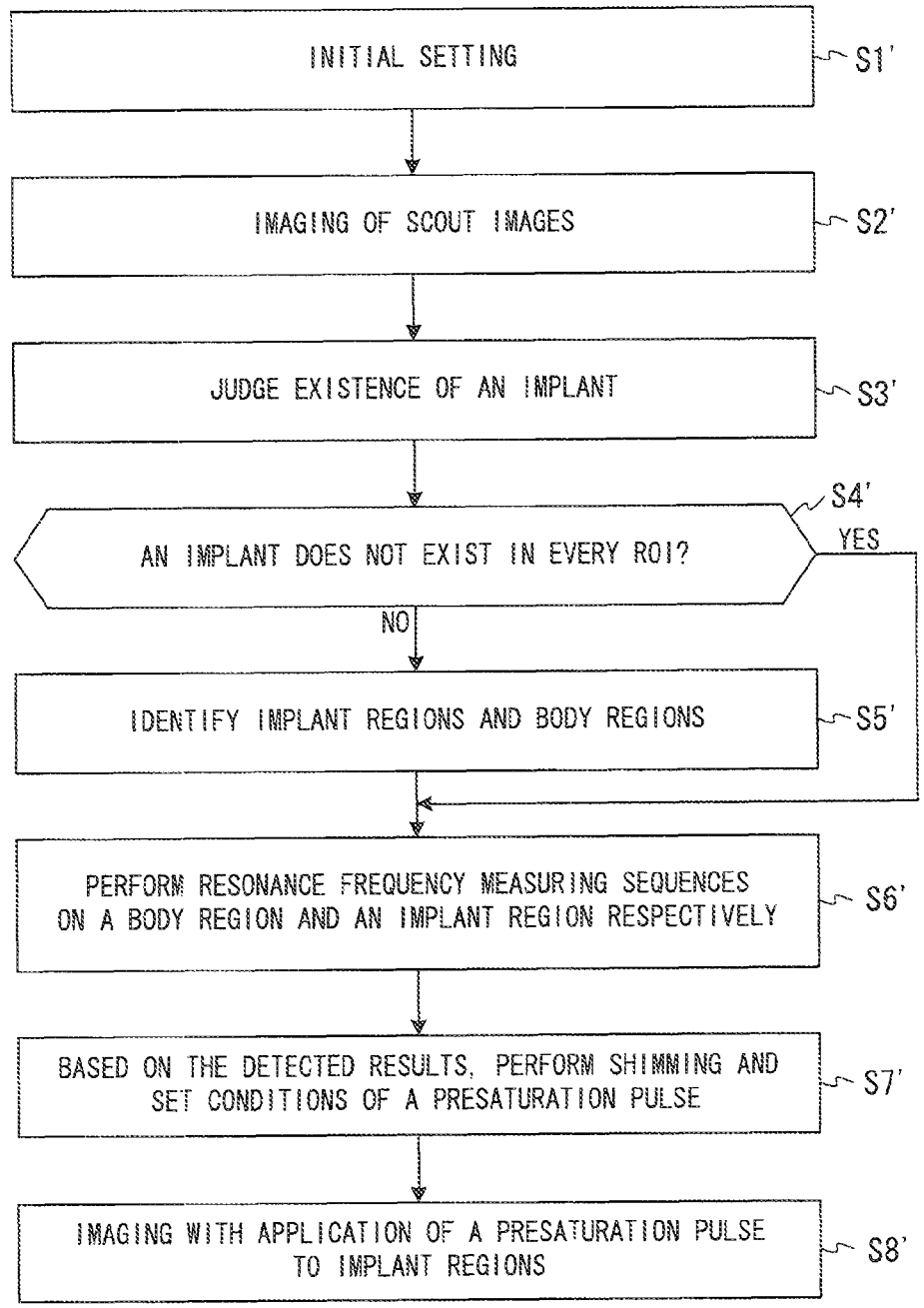
FIG. 11 is a flowchart illustrating a flow of a process performed by the MRI apparatus of the present invention, when a presaturation pulse for suppressing MR signals from implant regions is applied in imaging.

FIG. 11 is a flowchart illustrating a flow of a process performed by the MRI apparatus 20, when a presaturation pulse for suppressing MR signals from implant regions is applied in imaging. In FIG. 11, processing of step S1' to S5' is similar to those of step S1 to S5 in FIG. 10, respectively.

In the step S6', the center frequency setting unit 104 makes the MRI apparatus perform the following two resonance frequency measuring pulse sequences when it is judged that an implant exists in step 4', and the center frequency setting unit 104 makes the MRI apparatus perform one of the above two sequences when it is judged that an implant does not exist.

One of them is the resonance frequency measuring pulse sequence on a body region, and the center frequency setting unit 104 determines the center frequency of magnetic resonance of nuclear spins of hydrogen atoms in hydrogen tissues based on a frequency spectrum obtained by this resonance frequency measuring pulse sequence (this sequence is performed regardless of the existence of an implant).

The other of them is the resonance frequency measuring pulse sequence on an implant region, and this is performed when it is judged that an implant exists. For example, when an implant is formed with silicone, the center frequency setting unit 104 determines the center frequency of magnetic resonance of silicone based on a frequency spectrum obtained by this resonance frequency measuring pulse sequence on an implant region.

In the step S7', the center frequency setting unit 104 performs the following two processes when it is judged that an implant exists, and the center frequency setting unit 104 performs one of the above two processes when it is judged that an implant does not exist.

One of them is shimming, and this is performed regardless of the existence of an implant. That is the center frequency setting unit 104 corrects the center frequency of RF pulses so that the center frequency of RF pulses complies with the center frequency of magnetic resonance of nuclear spins of hydrogen atoms in hydrogen tissues detected in step S6'.

The other of them is setting of a frequency condition of a presaturation pulse for suppressing MR signals from silicone, and this is performed when it is judged that an implant exists. The center frequency setting unit 104 sets the center frequency of the presaturation pulse based on the center frequency of magnetic resonance of silicone detected in the step 6' (i.e. it is set so that the center frequency of the presaturation pulse complies with the center frequency of magnetic resonance of silicone).

In step 8', the presaturation pulse whose frequency condition is set in step S7' is spatially selectively applied to implant regions identified in step 5' and magnetic resonance imaging is performed to generate image data of the object in the aforementioned manner, when it is judged that an implant exists in step S4'. When it is judged that an implant does not exist in step S4', magnetic resonance imaging is performed without application of the aforementioned presaturation pulse to generate image data of the object in the aforementioned manner.

Note that in the step S7', the resonance frequency measuring pulse sequence on an implant region can be omitted. In this case, the center frequency setting unit 104 sets the center frequency of the presaturation pulse for suppressing MR signals from silicone, based on the following two information terms in step S7'. One of the information terms is the center frequency of magnetic resonance of nuclear spins of hydrogen atoms in hydrogen tissues of a body region detected in step S6'. The other of the information terms is the margin between the magnetic resonance frequency of silicone and the magnetic resonance frequency of the hydrogen tissues, and a known value of this margin can be used.

[7] Correspondences between terms used in the claims and terms used in the embodiment described above will be described. Note that the correspondences described below are just some of possible interpretations for reference and should not be construed as limiting the present invention.

The functions of the static magnetic field magnet 22, the shim coil 24, the gradient coil 26, the RF coil 28 and the control system 30 (see FIG. 1) that generate image data of the object P by applying gradient magnetic fields and RF pulses are an example of the image generating unit described in the claims.

The function of the entire control system 30 that acquires MR signals from body regions by the resonance frequency measuring pulse sequence based on the identification result of the judging unit 102 and the function of the center frequency setting unit 104 that corrects the center frequency of RF pulses based on frequency spectrum of the acquired. MR signals are examples of the correction unit described in the claims.

[8] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   an image generating unit which:
   (a) receives, from an object potentially containing an implant, magnetic resonance signals caused by transmission of at least one RF pulse having a center frequency in order to cause a nuclear magnetic resonance and, and
   (b) generates magnetic resonance image data of the object received based on the magnetic resonance signals;
   a judging unit which judges an implant region where at least a part of an implant exists inside the object, based on the generated magnetic resonance image data; and
   a correction unit which acquires magnetic resonance frequency information from a body region inside the object excluding the implant region, and corrects said center frequency of the at least one RF pulse based on the acquired magnetic resonance frequency information,
   wherein the judging unit is configured to extract a plurality of regions of interest from the generated image data, in order to obtain a smoothness of intensity distribution of the received magnetic resonance signals indicated by respective pixels of each of the regions of interest, and then also identify a position of at least a part of the body region based on the smoothness of the intensity distribution.

2. The magnetic resonance imaging apparatus according to claim 1,
wherein the judging unit is configured to identify the implant region by judging existence of an implant inside the object based on the smoothness of the intensity distribution.

3. The magnetic resonance imaging apparatus according to claim 1, wherein the plurality of regions of interest are linear regions of interest.

4. The magnetic resonance imaging apparatus according to claim 1, wherein the correction unit is configured to receive the magnetic resonance signals from the body region based on a judgment result of the judging unit, and to correct the center frequency of the at least one RF pulse by using a frequency spectrum of the received magnetic resonance signals as the magnetic resonance frequency information.

5. The magnetic resonance imaging apparatus according to claim 1, wherein the judging unit is configured to:
   (a) calculate a profile of pixel values of each of the regions of interest as the intensity distribution,
   (b) calculate a smoothness evaluation value indicative of smoothness of the profile for each of the regions of interest, and
   (c) judge existence of an implant part in each of the regions of interest based on the smoothness evaluation value.

6. The magnetic resonance imaging apparatus according to claim 5, wherein the plurality of regions of interest are linear regions of interest.

7. The magnetic resonance imaging apparatus according to claim 6, wherein the judging unit is configured to:
   (d) apply a filter cutting off spatial frequency components higher than a predetermined frequency to the intensity distribution,
   (e) calculate a variation of a pixel value of each pixel of the region of interest respectively before and after application of the filter,
   (f) define an absolute value of the variation averaged according to a number of pixels in each region of interest as the smoothness evaluation value, and
   (g) judge that a region of interest whose smoothness evaluation value is equal to or lower than a threshold value includes an implant part.

8. The magnetic resonance imaging apparatus according to claim 5, wherein the judging unit is configured to:
   (d) divide a region of interest judged as including an implant part into a plurality of divided regions,
   (e) calculate the smoothness evaluation value for each of the divided regions, and
   (f) discern between a divided region consisting of only a body region and a divided region including an implant part based on the smoothness evaluation value.

9. The magnetic resonance imaging apparatus according to claim 8, wherein the correction unit is configured to:
   receive the magnetic resonance frequency information from the divided region consisting of only a body region in a region of interest judged as including an implant part based on the discernment result of the judging unit.

10. The magnetic resonance imaging apparatus according to claim 1 wherein the judging unit is configured to:
    (a) calculate a profile of each pixel value of each of the regions of interest as the intensity distribution,
    (b) apply a filter cutting spatial frequency components higher than a predetermined frequency to the intensity distribution,
    (c) calculate a variation of a pixel value of each pixel of the region of interest respectively before and after application of the filter,
    (d) define an absolute value of the variation averaged according to a number of pixels in each region of interest as the smoothness evaluation value, and
    (e) judge that a region of interest whose smoothness evaluation value is equal to or lower than a threshold value includes an implant part.

11. The magnetic resonance imaging apparatus according to claim 10, wherein the judging unit is configured to:
    (f) extract a plurality of linear regions of interest as the plurality of regions of interest.

12. The magnetic resonance imaging apparatus according to claim 1 wherein the correction unit is configured to:
    (a) repeat a sequence of acquiring the magnetic resonance signals from the body region and
    (b) calculate a provisional center frequency of the at least one RF pulse based on a frequency spectrum obtained from the magnetic resonance signals and
    (c) perform a judgment processing of judging whether or not a margin between a finally calculated provisional center frequency and a previously calculated provisional center frequency is within a range of a predetermined value, until a result of the judgment processing becomes affirmative, and
    (d) then determine the finally calculated provisional center frequency as a corrected center frequency of the at least one RF pulse.

13. The magnetic resonance imaging apparatus according to claim 1, wherein the correction unit is configured to:
    (a) repeat a sequence of acquiring the magnetic resonance signals from the body region and
    (b) calculate a provisional center frequency of the at least one RF pulse based on a frequency spectrum obtained from the magnetic resonance signals and
    (c) perform a judgement processing of judging whether or not a margin between a finally calculated provisional center frequency and a previously calculated provisional center frequency is within a range of a predetermined value, until a result of the judgment processing becomes affirmative, and
    (d) then determine the finally calculated provisional center frequency as a corrected center frequency of the at least one RF pulse.

14. The magnetic resonance imaging apparatus according to claim 1, wherein the implant includes an inside part formed from at least one of silicone, physiological saline solution and water absorptive polymer.

15. The magnetic resonance imaging apparatus according to claim 1,
wherein the correction unit is configured to:
    (a) acquire the magnetic resonance frequency information from the body region and the implant region respectively by performing resonance frequency measuring sequences on the body region and the implant region respectively,
    (b) correct the center frequency of the at least one RF pulse based on the magnetic resonance frequency information from the body region, and set a center frequency of a prepulse in order to suppress a magnetic resonance signal from an implant based on the magnetic resonance frequency information from the implant region; and (c) wherein the image generating unit is configured to;

(d) receive, from the object, the magnetic resonance signals caused by transmission of the prepulse whose center frequency is set by the correction unit and (e) also receive the at least one RF pulse whose center frequency is corrected by the correction unit in order to cause a nuclear magnetic resonance, and (f) again generate the image data of the object based on the magnetic resonance signals.

16. A magnetic resonance imaging apparatus comprising:

an image generating unit which (a) receives, from an object potentially containing an implant, magnetic resonance signals caused by transmission of at least one RF pulse having a center frequency in order to cause nuclear magnetic resonance, and (b) generates magnetic resonance image data of the object based on the received magnetic resonance signals; and a judging unit which extracts a plurality of regions of interest from the generated image data, obtains a smoothness of intensity distribution of the received magnetic resonance signals indicated by respective pixels of each of the regions of interest, and then judges an existence of an implant inside the object based on the smoothness of the intensity distribution thus making the center frequency of the at least one transmitted RF pulse correctable in order to selectively avoid the implant in an acquisition region of the magnetic resonance image data.

17. The magnetic resonance imaging apparatus according to claim 16, wherein:

the judging unit is configured to identify an implant region where an implant part exists in terms of position, when the judging unit judges that an implant exists inside the object; and the image generating unit is configured to:
   (a) apply a prepulse configured for suppressing the magnetic resonance signal from the implant to the implant region based on an identification result of the judging unit,
   (b) receive the magnetic resonance signals from the object caused by transmission of the at least one RF pulse, and)
   (c) again generate image data of the object based on the magnetic resonance signals.

18. A magnetic resonance imaging method comprising:

receiving, from an object potentially containing an implant, magnetic resonance signals caused by transmission of at least one RF pulse having a center frequency in order to cause nuclear magnetic resonance;

generating magnetic resonance image data of the object based on the received magnetic resonance signals;

extracting a plurality of regions of interest from the generated magnetic resonance image data;

obtaining a smoothness of intensity distribution of the received magnetic resonance signals indicated by respective pixels of each of the regions of interest; and judging an existence of an implant in the object based on the smoothness of the intensity distribution thus making the center frequency of the at least one transmitted RF pulse correctable in order to selectively avoid the implant in acquisition re on of the magnetic resonance image data.

* * * * *